(12) United States Patent
Khan

(10) Patent No.: US 8,506,119 B2
(45) Date of Patent: Aug. 13, 2013

(54) EFFICIENT, UNIFORM, AND DIMMABLE SIGN OR DISPLAY ILLUMINATION METHODS USING OVERLAPPED LED MODULES ON A RAISED GRID PLATFORM

(76) Inventor: Mujibun Nisa Khan, Colts Neck, NJ (US)

( * ) Notice: Subject to any disclaimer, the term of this patent is extended or adjusted under 35 U.S.C. 154(b) by 635 days.

(21) Appl. No.: 12/657,846

(22) Filed: Jan. 28, 2010

(65) Prior Publication Data
US 2011/0179683 A1    Jul. 28, 2011

(51) Int. Cl.
*F21V 21/00*    (2006.01)

(52) U.S. Cl.
USPC ............. 362/249.02; 362/249.06; 362/249.11

(58) Field of Classification Search
USPC .................. 362/249.01, 249.02, 231, 249.03, 362/249.06, 249.11, 631; 40/544, 541, 550, 40/551, 552
See application file for complete search history.

(56) References Cited

U.S. PATENT DOCUMENTS

| | | | |
|---|---|---|---|
| 6,631,575 B1 * | 10/2003 | Voelzke et al. ................. 40/451 |
| 6,932,495 B2 * | 8/2005 | Sloan et al. ................... 362/294 |
| 7,064,674 B2 * | 6/2006 | Pederson ................. 340/815.45 |
| 7,088,904 B2 * | 8/2006 | Ryan, Jr. ....................... 385/147 |
| 7,175,329 B1 * | 2/2007 | Chou ............................. 362/612 |
| 7,322,718 B2 * | 1/2008 | Setomoto et al. ............. 362/276 |
| 7,470,055 B2 * | 12/2008 | Hacker et al. ................. 362/640 |
| 7,648,254 B2 * | 1/2010 | Yoo et al. ................. 362/249.01 |
| 7,677,914 B2 * | 3/2010 | Nall et al. ...................... 439/420 |
| 7,775,681 B2 * | 8/2010 | Kim et al. ................ 362/249.02 |
| 7,909,483 B2 * | 3/2011 | Jacobs et al. .................. 362/276 |
| 7,976,210 B2 * | 7/2011 | Shinozaki ..................... 362/631 |
| 2007/0242477 A1 * | 10/2007 | Yoo et al. ...................... 362/612 |
| 2008/0049164 A1 * | 2/2008 | Jeon et al. ....................... 349/61 |
| 2008/0244944 A1 * | 10/2008 | Nall et al. ....................... 40/544 |
| 2008/0298058 A1 * | 12/2008 | Kan et al. ...................... 362/240 |

* cited by examiner

*Primary Examiner* — John A Ward

(57) ABSTRACT

Concepts for increasing brightness and uniformity and providing dimming for LED-illuminated signs and display are disclosed. Substantial increase in brightness is achieved via reducing the distance between LED modules and the sign or display they illuminate by placing the LEDs on a raised grid platform constructed with a plurality of intersecting plates. Whenever two plates intersect, a "grid-node" is formed, creating a plurality of intersections and grid nodes in a two-dimensional array. On each grid-node, two distinct and electrically isolated LED sub-modules are placed. By connecting all LED sub-modules parallel to one dimension (e.g., X-axis) in one series, and all LED sub-modules parallel to the other dimension (e.g., Y-axis) in another series, two electrically isolated LED series are created. Lighting up both series provide maximum brightness and good uniformity; lighting up only one series allows dimming for illuminated signs or displays without any drive current adjustment.

7 Claims, 10 Drawing Sheets

EFFICIENT, UNIFORM, AND DIMMABLE SIGN OR DISPLAY ILLUMINATION METHODS USING OVERLAPPED LED MODULES ON A RAISED GRID PLATFORM

BACKGROUND OF THE INVENTION

Field of the Invention

Solid state lighting (SSL), which uses light emitting diodes (LED) as the light source, has been instrumental in the illumination and display industries recently. Advances in SSL has been extraordinary in terms of how fast their efficiency, light output and quality have improved in the past few years. Already many diverse applications in illumination and display industries have gained acceptance because of the notable improvement and because LEDs promise to offer significant energy savings over current light sources; further, their flexible form factors, scaling, attractive color combination, and electronic control capabilities have attracted many lighting and display designers.

Although SSL capabilities are unique and promising, the lighting and display industries still face many challenges. One such challenge is proper thermal management of LEDs because light coming from an LED source, although produce very little heat radiatively, the LED chip does produce a substantial amount of heat on the back side that must be removed conductively from the chip. Signage or display illumination designs require some parameter optimizations that include the number of LED modules to be used, their brightness level, placement, and thermal management in order to minimize energy consumption, maximize life span, and achieve attractively illuminated signs and displays.

Currently LED-illuminated channel letter and cabinet signs directly place the LED modules against the back surface of the signage construction unit, where most of these units are perhaps 5 to 10 inches thick or thicker. This means that the surface to be illuminated is approximately this thickness away from the light sources, which reduces the surface illuminance by the square of the thickness or the depth of the sign. This construction also does not allow for good thermal management because LEDs operate best if properly designed heat sinks are placed at the back side of the modules.

Current LED lamp modules for sign and display illumination are also not designed to be placed in a highly-density lamp array or any other high-density module configuration. This prevents one from achieving a uniformly illuminated sign or display due to non-uniform and sparse placements of LED modules inside the sign cabinet. Moreover, because fewer LED modules are used, each module must have a higher luminous area or luminance to produce an acceptable amount of illumination at the sign surface.[1] Higher luminance or higher luminous area (i.e., large LED chip) both require more complex or difficult LED chip technologies operating at higher current—all leading to higher cost and shorter lifespan.

This invention relates to a set of methods to increase surface illumination of a sign or display without increasing the luminance of LED modules, while providing better thermal management of the display unit and more uniform surface illumination. Better thermal management leads to longer lifespan of the display unit.

More specifically this invention relates to obtaining a highly optimal performance of an LED-lit sign or display unit by using a set of configurations that increase the surface illumination by using a high LED module density and by reducing the distance or gap between the LED light sources and the display surface. The raised grid platform configuration in this invention not only allows this gap to be reduced, but also allows for a very high LED module density to be used in channel letters, cabinet signs, or other display by overlapping two modules in an orthogonal manner on each grid node. The high density of modules leads to a substantially uniform surface illumination, and allows each LED module to be operated at lower current and thereby increasing the lifespan of the electric or electronic sign or display unit.

All design concepts described here can also be applied to organic LED (OLED) lamp modules where OLEDs typically have larger chip sizes than conventional LEDs; multiple OLEDs may be used on modules placed on the grid-nodes. The advantage of OLEDs may be that they can be large area devices or modules and can be placed on a raised grid platform with little or no spacing between the OLEDs and the sign surface, essentially covering the entire surface of the display, in principle. Theoretically this would produce perfect and most efficient surface illumination!

Currently most LED-lit signs and displays use a large gap between the LED lamps and the surface to be illuminated. The gap is several times the depth of the LED modules. This invention reduces this gap substantially.

Currently most LED-lit signs and displays do not use a grid as a raised platform and have little or poor thermal management schemes to conduct heat away from the backs of LED modules. This invention allows for effective thermal management by either using the grid as a heat sink, or being able to place additional heat sinks in the gaps between grid plates or fins, or use these gaps to allow for heat dissipation through convection.

Currently LED-lit signs use coarse and non-uniform arrangements of LED modules inside channel letters, cabinet signs and other displays. This causes non uniform surface illumination and forces each LED module or chip to run at higher current to provide higher luminance, leading to "hot spots" and a shorter lifespan for the LEDs. This invention offers solutions to run LEDs at lower current by using more LED modules in the grid configuration, which increases the illumination uniformity.

FIG. 2 in this disclosure shows one of the current methods or prior art of lighting a channel letter sign with LED modules. Such a scheme can waste much of the LED light before it hits the sign surface because of the large gap between the LED modules and the sign surface.

The designs proposed in this invention shown are in FIGS. 1, 3, 4, 5, 6, 7, and 8 which do not include the prior-art figure inserts. These design concepts provide more efficient surface illumination for signs and displays and can expand the lifespan of signage and display products by adopting better thermal management schemes.

SUMMARY OF THE INVENTION

Illuminated channel letters, sign cabinets, and displays must achieve certain levels of brightness to satisfy customer expectations. To quantify that brightness, luminance measured in nits or candela/square-meter ($cd/m^2$), is used as the technical parameter; alternatively, an illumination designer may measure illuminance at the viewer's eye plane and simply correlate this to the luminance value of the display. Illuminance is measured in lux (lumen/square-meter) or foot-candles. To properly illuminate a sign or display, each LED-lamp module used in the configuration inside the display unit must be adequately bright to radiate the required amount of light to the sign or display surface.

In order to determine the luminance required of the LED modules to achieve a certain display brightness level, this simple formula relating luminance and illuminance may be used:[2]

$$E_v = \frac{L \times S}{D^2} \qquad \text{Eq. (1)}$$

where E, is the illuminance at the sign surface, L is the luminance of the lamp module, S is the surface area of the lamp, and D is the normal or vertical distance from the center of the lamp to the illuminated surface. This essentially is the well-known inverse-square relation that Swiss German physicist Johann Lambert (1728-1777) helped formulate. For simplicity, only the normal incident angle is considered, neglecting cross illumination from neighboring LEDs.

Applying this functional relationship, a designer can optimize LED sign illumination to produce bright and uniform channel letters, signs, and other displays that are more energy efficient and longer lasting than most designs of today.

This disclosure offers several design concepts that promise to generate brighter and longer-lasting channel-letters, cabinet signs, and other displays that use LEDs as light sources. The design concepts use a 2-dimensional grid platform where composite LED modules constructed from LED sub-modules can be placed at each grid-node. The grid platform reduces the distance between the LED light sources and the surface they illuminate. This increases the surface illumination exponentially or at least nearly exponentially as the surface illuminance is inversely proportional to the square of the distance between the surface and the light source, as discussed above through Equation (1). This also has a second benefit: the raised grid platform creates more clear space at the back of the LED modules for better thermal management because LEDs produce a significant amount of heat at the back that needs to be removed from the LED chip junction area using conduction. Better thermal management can be achieved by using the grid as a heat sink or to place additional or larger heat sinks in the clear space between intersecting plates that create the raised grid. The clear space can also enable heat removal via convection or provide for even greater air flow using fans, if needed. Furthermore, this grid configuration can also allow for additional heat management through thermal vias or holes for air ventilation at the back of the sign or display unit.

As explained previously, the proposed configuration reduces the distance between LED modules and the illuminated surface. Since LEDs do not radiate heat from the front of the devices, the reduced space between them and the surface they illuminate is not detrimental.

Grids can be made in different sizes, including rectangular, square, triangular shapes, or perhaps even curved or non-regular shapes. This is to accommodate different letters that have slanted shapes such as "A", and curved shapes such as "S".

In this invention, two types of "horizontal" LED sub-modules can be placed at each grid node. The horizontal sub-modules can be similar LED engines such as those currently found in the industry, as shown in FIG. 5 as a "Prior Art". These modules are called "horizontal" sub-modules because the vertical direction is defined in this disclosure as the direction of the surface normal. In this invention, the two types of horizontal sub-modules are labeled as HT1 and HT2 sub-modules, for horizontal-transverse-1 and horizontal-transverse-2 sub-modules, respectively. HT1 and HT2 sub-modules are orthogonal to each other, meaning one is rotated 90 degrees with respect to the other on the same horizontal plane, and both HT1 and HT2 are orthogonal to the vertical direction or the direction of the surface normal.

HT1 and HT2-sub-modules may use printed circuit boards to provide positive (p-) and negative (n) connections as shown in FIG. 3; the sub-module tops should be protected with electrically insulated material; LED chips themselves may be surface-mount optical modules, protected with dome-shaped lenses. HT1 and HT2 sub-modules are overlapped together as shown in FIG. 4 to form a combined or composite "plus-sign" module. These "plus-sign" modules are placed on the 2-dimensional grid nodes.

The design elements of this invention offer greater surface illumination or higher luminance displays without increasing the luminance of the LEDs themselves. This is true because of two reasons, both of which are supported by Eq. (1): 1) the LEDs are closer to the sign surface, i.e. "D" is reduces in Eq. (1); 2) the surface illumination is increased with a larger number of lower-illuminance LEDs rather than with a fewer number of higher-luminance LEDs.

The proposed LED-illumination methods in this invention disclosure provide the following:

a. Exponentially or nearly exponentially brighter surface illumination compared to existing methods that place LED modules against the back of the sign or display unit.

b. Allows placement of a many LED modules at a very high density within the sign or display unit to generate a substantially uniform illumination.

c. Reduction in LED drive current requirement per LED chip or module because many LED chips or modules are used at low brightness level, rather than fewer LED chips or modules used with high brightness level.

d. Reduction in LED chip luminous area since many discrete LED chips can be used to illuminate a particular surface rather than a few high-brightness and large-area LEDs that are more difficult to manufacture.

e. Allow for LED modules to be detachable at the grid-nodes and thereby providing easy replacement of faulty or burnt-out LED modules when necessary without affecting the connecting wires, soldering, or rewiring the LED modules within the sign or display unit.

f. The grid can act as a heat sink or additional heat sinks or fans or ventilation paths can be incorporated in this design because LEDs do not have to be attached against the back of the sign or display unit directly and more free space is created by using the 2-dimensional raised grid platform.

g. The LED modules are wired in two separate transverse horizontal electrical series (placed orthogonally to each other on a grid), which are electrically isolated from each other and therefore can be independently lit. Lighting up both series provide maximum brightness and good uniformity; lighting up one series allow dimming for illuminated signs or displays without any drive current adjustment.

h. A faulty LED chip or module does not affect the operation of the horizontal series it is part of or the other orthogonal horizontal series.

Some or all of the designs of this invention may produce LED-illuminated channel letters, cabinet signs, computer/laptop or other displays as well as under cabinet luminaires. This invention could be applied as backlighting methods to produce any displays that may compete with current LED-illuminated displays in cell-phones, laptop, computers, flat-screen televisions and others.

The proposed LED-illumination design may use multiple LED chips or dies in a single module used in the two transverse horizontal series to form a two-dimensional grid.

This LED modules and sub-modules used in this grid configuration for sign and display illumination may be white or a single-color (e.g., red, blue, green, etc.) light sources.

DETAILED DESCRIPTION OF PREFERRED EMBODIMENTS

Figure 1:
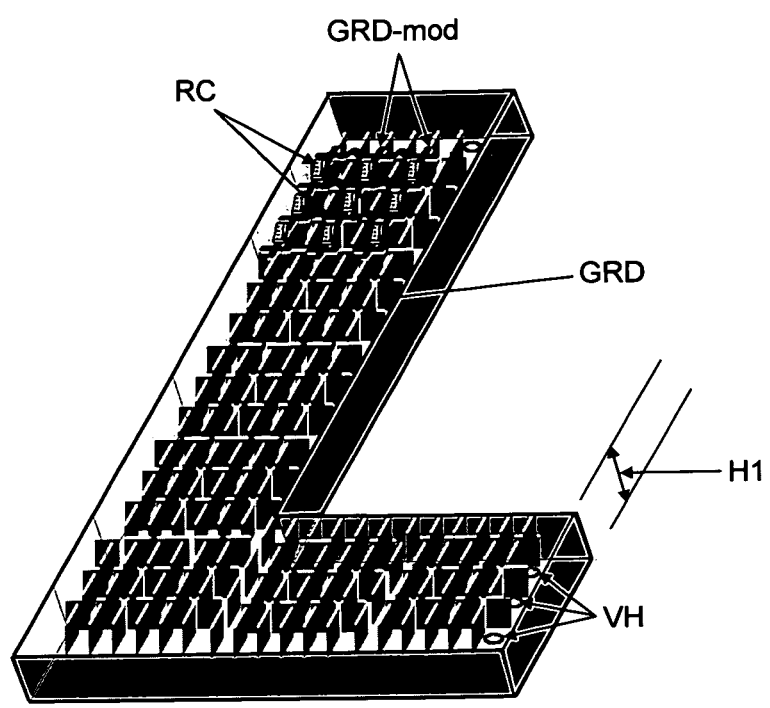
FIG. 1 shows a signage channel letter "L" without the top cover or face showing the 2-dimensional grid inside. The LED modules that look like "plus" signs are placed on grid nodes to raise their height from the channel letter bottom, or back, or base.

FIG. 1 shows a signage channel letter "L" without the top cover or face showing the 2-D (2-dimensional) grid, GRD, inside. The LED modules, denoted as GRD-Mod, that look like "plus" signs are placed on grid nodes to raise their height from the channel letter bottom, or back, or base. Adjacent GRD-Mod's are connected with ribbon connector RC as shown in the figure. The signage channel letter "L" has height H1, which allows a grid height to be close to H1. Thus the grid, GRD, may also act like a heat sink for the LED modules, helping to remove the heat generated by the LEDs from their back sides.

Figure 2:
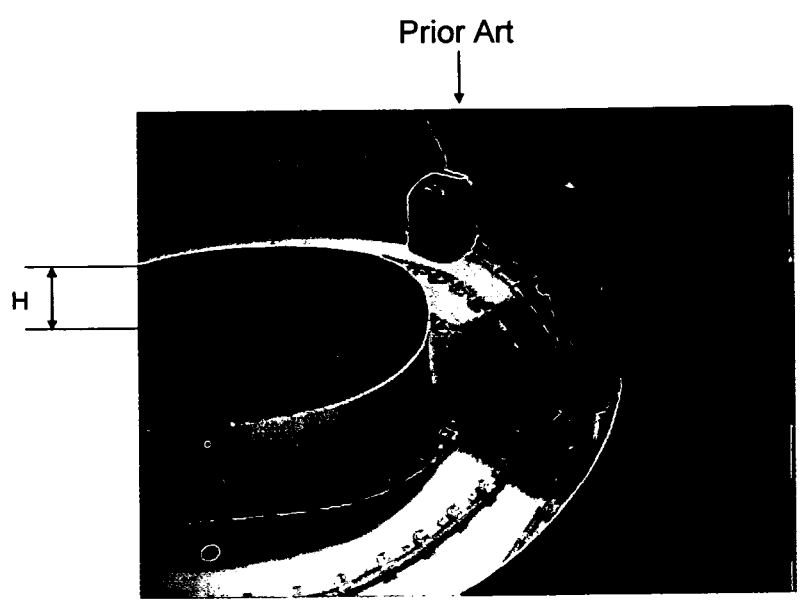
FIG. 2 shows a photograph from "Prior Art". In the photograph, a sign-maker is connecting GE Lumination's LED modules to the bottom of the channel-letter "O", shown without the sign face; there is a large distance between the LED light source and the sign face—in this case about 8 inches. The sign face illumination drops as the square of the distance between the LED light source and the face.

FIG. 2 shows a photograph from "Prior Art". In the photograph, a sign-maker is connecting GE Lumination's LED modules to the bottom of the channel-letter "O", shown without the sign face. The channel letter "O" has height H which creates a large distance between the LED light source and the sign face—in this case about 8 inches because H is higher than a grown man's hand in this photograph. The sign face illumination drops as the square of the distance between the LED light source and the face.

Figure 3:
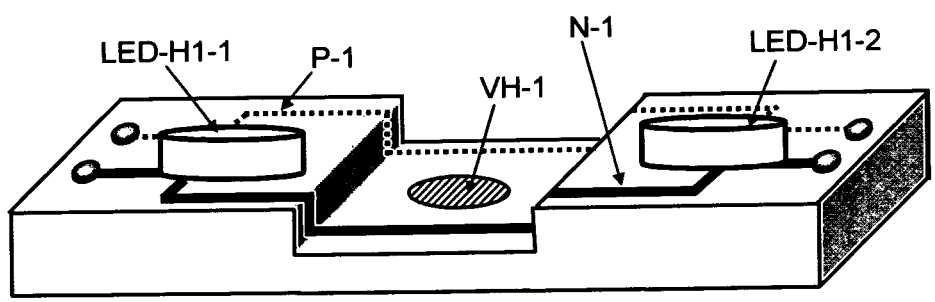
FIG. 3 shows the first of the two proposed LED sub-modules of this invention, called the HT1-Module. The HT1-Module is one of the two horizontal transverse link sub-modules. This sub-module is equivalent to GE Lumination's LED engine shown as prior art in FIG. 5, in the sense that two or more LED chips are packaged in one module as an electrically connectable "LED engine".

FIG. 3 shows the first of the two proposed LED sub-modules of this invention, called the HT1-Module (the entire ensemble in FIG. 3). The HT1-Module is one of the two horizontal transverse link sub-modules. This sub-module is equivalent to GE Lamination's LED engine shown as prior art in FIG. 5, in the sense that two or more LED chips (or surface-mount LEDs) are packaged in one module as an electrically connectable "LED engine". In this figure, the HT1-Module consists of two separate surface mount (SMT) LEDs called LED-H1-1 and LED-H1-2 respectively. These are electrically connected via printed-wire on a circuit board where LED-H1-1 and LED-H1-2 are mounted. The printed-wire circuit consists of P-1, shown in dotted line, which connects the p-contacts of the SMT LEDs; it also consists of N-1, shown in solid line, which connects the n-contacts of the SMT LEDs. In the middle of the HT1-Module is a via (through) hole, VH-1.

Figure 4:
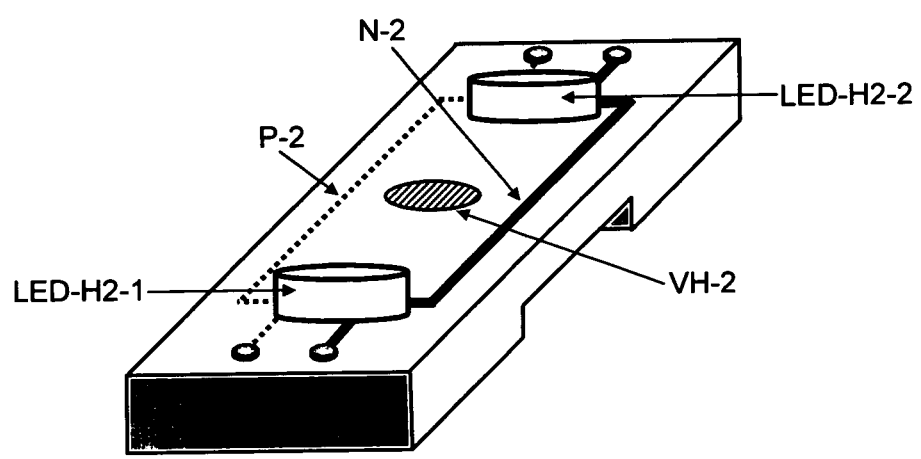
FIG. 4 shows the second of the two proposed LED sub-modules of this invention, called the HT2-Module. The HT2-Module is one of the two horizontal transverse link sub-modules. This sub-module is equivalent to GE Lumination's LED engine shown as prior art in FIG. 5, in the sense that two or more LED chips are packaged in one module as an electrically connectable "LED engine".

FIG. 4 shows the second of the two proposed LED sub-modules of this invention, called the HT2-Module (the entire ensemble in FIG. 4). The HT2-Module is one of the two horizontal transverse link sub-modules. This sub-module is equivalent to GE Lumination's LED engine shown as prior art in FIG. 5, in the sense that two or more LED chips (or surface-mount LEDs) are packaged in one module as an electrically connectable "LED engine". In this figure, the HT2-Module consists of two separate surface mount (SMT) LEDs called LED-H2-1 and LED-H2-2 respectively. These are electrically connected via printed-wire on a circuit board where LED-H2-1 and LED-H2-2 are mounted. The printed-wire circuit consists of P-2, shown in dotted line, which connects the p-contacts of the SMT LEDs; it also consists of N-2, shown in solid line, which connects the n-contacts of the SMT LEDs. In the middle of the HT2-Module is a via hole, VH-2.

Figure 5:
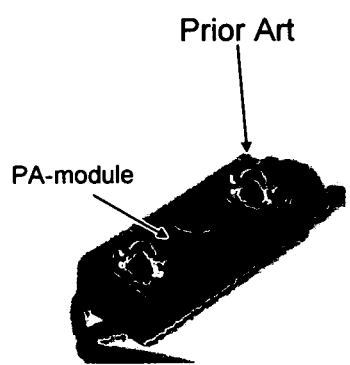
FIG. 5 shows a typical, prior-art "LED engine" module from GE Lumination. These modules are most commonly used to illuminate channel-letter and cabinet signs.

FIG. 5 shows a typical "prior-art" "LED engine" from GE Lumination, denoted as PA-module. There are two surface mount or SMT LEDs in this module. FIGS. 3 and 4 refer to this type of module for "LED engine" comparison.

Figure 6:
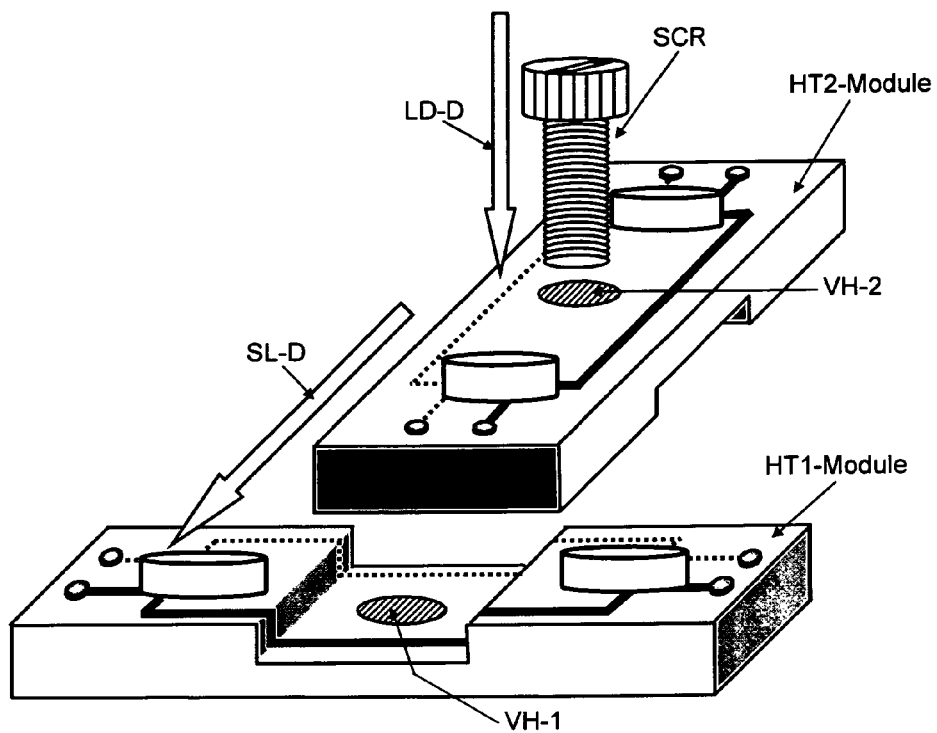
FIG. 6 shows that the HT1-Module and the HT2-Module can be mechanically attached with a screw by putting the HT2-Module on top of the HT1-Module; one can simply translate the HT2-Module forward until the holes line up and then place the screw through both holes; the HT1- and HT2-Modules are not electrically connected.

FIG. 6 shows that the HT1-Module and the HT2-Module can be mechanically attached with a screw, SCR, by putting the HT2-Module on top of the HT1-Module; one can simply translate the HT2-Module forward in the denoted SL-D direction (see SL-D arrow) until the VH1 and VH2 line up and then place the screw through both holes in the LD-D direction (see LD-D arrow); the HT1- and HT2-Modules are not electrically connected. The reason for having two distinct and separate sub-modules is to obtain dimming capability and higher fault tolerance, meaning that if one LED goes bad in an HT1 or HT2 module, only one module with two or smaller number of LEDs needs to be replaced.

Figure 7:
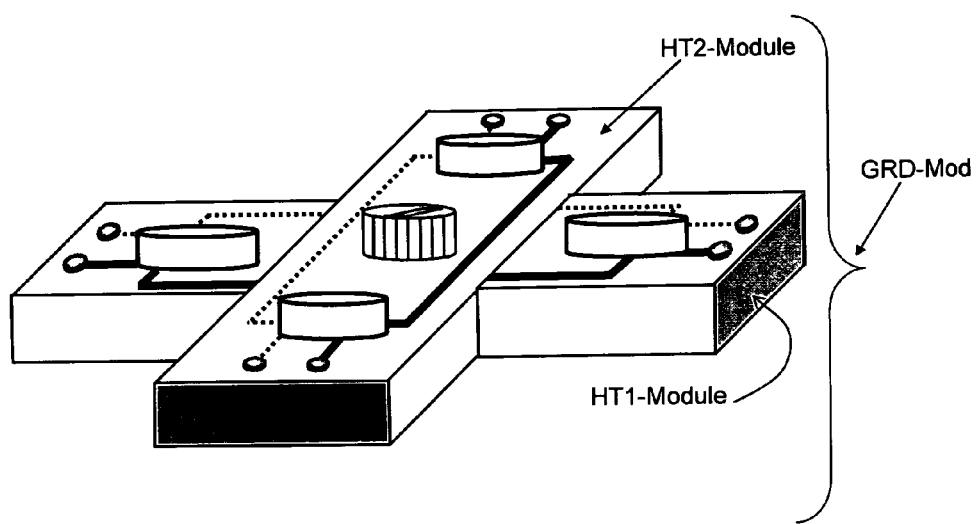
FIG. 7 shows that the HT1-Module and the HT2-Module are mechanically attached together with a top screw to form a "plus" sign; this combined or composite "plus" LED module engine, GRD-Mod, can be mounted on grid nodes as shown in FIG. 1.

In FIG. 7, the HT1-Module and the HT2-Module are mechanically attached together with a top screw to form a "plus" sign; this combined or composite "plus" LED module engine, GRD-Mod, can be mounted on grid nodes as shown in FIG. 1. The HT1- and HT2-Modules can be easily taken apart if they need to be replaced, providing flexibility to replace faulty modules.

Figure 8:
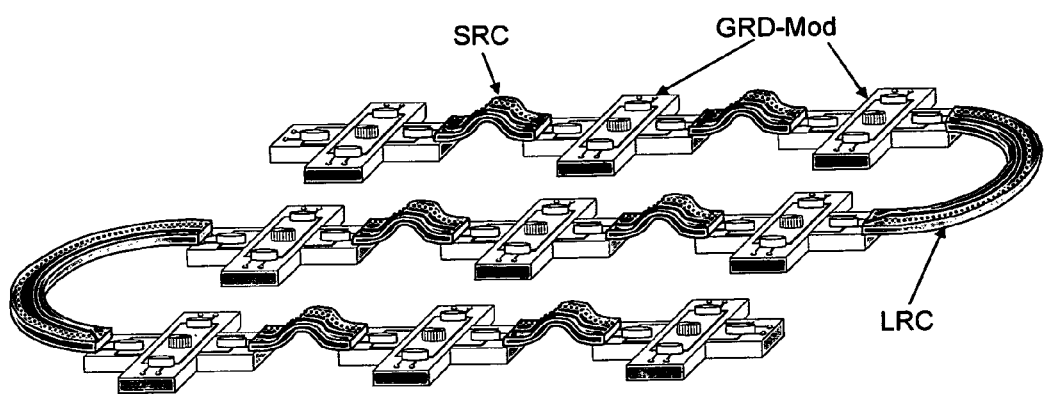
FIG. 8 shows that the HT1-Modules of the combined or composite plus-sign modules can each be connected with a ribbon connector to form a series; the adjacent modules in each row can be connected with shorter ribbon connectors that connect "p" and "n" connections together. Each row can be connected to the adjacent row via a longer loop ribbon connector, which needs twisting (i.e., switching spatial position) the "p" and "n" wires at one end. Adjacent row ribbon connector can also be a single twist ribbon connector to accomplish the spatial switching.

FIG. 8 shows that the HT1-Modules of the combined or composite plus-sign modules, GRD-Mod's, can all be connected using ribbon connectors in series; the adjacent modules in each row can be connected with a shorter ribbon connector, SRC, that connect the adjacent modules' "p" and "n" connections together. Each row can be connected to the adjacent row via a longer loop ribbon connector, LRC, which needs twisting (i.e., switching spatial position) the "p" and "n" wires at one end. The adjacent row ribbon connector, i.e., LRC, can also be a single twist ribbon connector to accomplish the spatial switching. It is important to note that these twists in the LRC's are necessary to connect all "identical (by design)" HT1 HT1-Modules in one electrical series. The HT1-Modules are the "row" modules of the two-dimensional grid.

Figure 9:
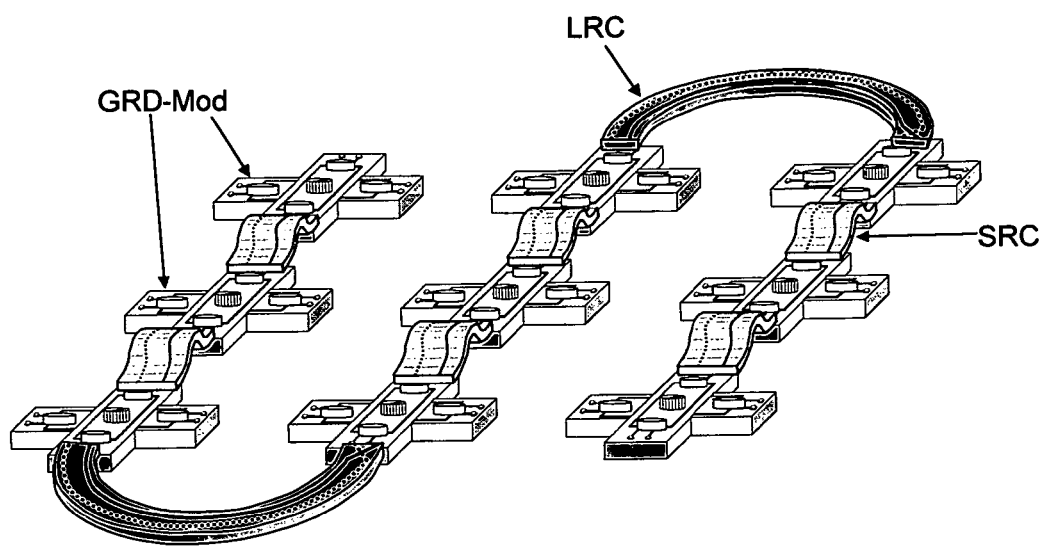
FIG. 9 shows that the HT2-Modules of the combined or composite plus-sign modules can each be connected with a ribbon connector to form a series; the adjacent modules in each column can be connected with shorter ribbon connectors that connect "p" and "n" connections together. Each column can be connected to the adjacent column via a longer loop ribbon connector, which needs twisting (i.e., switching spatial position) the "p" and "n" wires at one end. Adjacent column ribbon connector can also be a single twist ribbon connector to accomplish the spatial switching.

FIG. 9 shows that the HT2-Modules of the combined or composite plus-sign modules, GRD-Mod's, can all be connected using ribbon connectors in series; the adjacent modules in each column can be connected with shorter ribbon connector, SRC, that connect the adjacent modules' "p" and "n" connections together. Each column can be connected to the adjacent column via a longer loop ribbon connector, LRC, which needs twisting (i.e., switching spatial position) the "p" and "n" wires at one end. The adjacent column ribbon connector, i.e., LRC, can also be a single twist ribbon connector to accomplish the spatial switching. It is important to note that these twists in the LRC's are necessary to connect all "identical (by design)" HT2 HT2-Modules in one electrical series. The HT2-Modules are the "column" modules of the two-dimensional grid.

Figure 10:
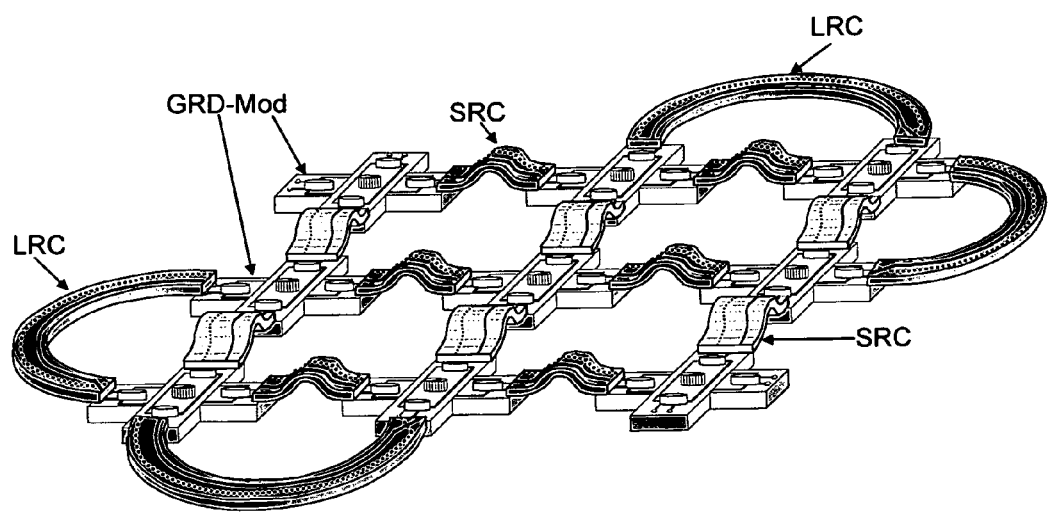
FIG. 10 shows the combination configuration of FIG. 8 and FIG. 9: all HT1-Modules of the combined or composite "plus-sign" modules are connected in series with ribbon connectors and adjacent "row" ribbon connectors; similarly all HT2-Modules of the combined plus-sign modules are connected in another series with ribbon connectors and adjacent "column" ribbon connectors. All HT1-Modules are connected in one electrical series and all HT2-Modules are connected in a separate electrical series; the two series are electrically isolated from each other.

FIG. 10 shows the combination configuration of FIG. 8 and FIG. 9: all HT1-Modules of the combined or composite plus-sign modules, GRD-Mod's, are connected in series with short ribbon connectors, SRC's, and adjacent "row" ribbon connectors, LRC's; similarly all HT2-Modules of the combined plus-sign modules, GRD-Mod's, are connected in another series with short ribbon connectors, SRC's and adjacent "column" ribbon connectors, LRC's. All HT1-Modules are connected in one electrical series and all HT2-Modules are connected in a separate electrical series; the two series are electrically isolated from each other.

REFERENCES

1. M. Nisa Khan, "Effective Illumination of Internally-lit LED Signs", LED Professional Review, Issue 14, Jul./Aug. 2009, Dornbirn, Austria. http://www.led-professional-.com/subscriptions/30/1444-led-professional-review-ju-lyaug-2009.html
2. *IESNA Technical Memorandum TM*-11-00.

What is claimed is:

1. An LED-illuminated sign or display unit design comprising:
    (a) a raised platform constructed with a plurality of flat plates or fins of certain heights which intersect with a first and second plate to form a grid-node, thus creating a plurality of grid-nodes at plurality of intersections that construct a two-dimensional array shaped as a square, rectangular, or any non-regular grid;
    (b) a plurality of LED sub-modules denoted as "horizontal-transverse-1" or "HT1" placed parallel to X axis of the two-dimensional array;
    (c) a plurality of LED sub-modules denoted as "horizontal-transverse-2" or "HT2" placed parallel to Y-axis of the two-dimensional array wherein these HT2 sub-modules are mounted over the HT1 sub-modules, following a rotation of 90 degrees with respect to the HT1 sub-modules and wherein the HT1 and HT2 sub-modules are electrically isolated from one another;
    (d) a plurality of composite LED modules, each shaped as a "plus-sign", constructed from overlapped the HT1 and HT2 sub-modules wherein the composite LED modules are placed at each grid-node of the raised grid platform, which serves as a base for the LED lamp module assemblies when placed at the back of a sign or display, reducing the distance between the light source and the sign it illuminates.

2. An LED-illuminated sign or display unit according to claim 1, wherein HT1 LED sub-modules parallel to the X axis are connected in one electrical series and HT2 LED sub-modules parallel to the Y axis are connected in a separate electrical series.

3. An LED-illuminated sign or display unit according to claim 2, wherein the adjacent or neighbor LED sub-modules are connected via wires or detachable flat or otherwise ribbon wires with pin connectors at both ends that can be inserted into each LED sub-module's electrical input and output sockets.

4. An LED-illuminated sign or display unit according to claim 2, wherein both electrical series comprising of LED HT1 and HT2 sub-modules are turned on to generate higher brightness with more uniform illumination and only one electrical series comprising of either HT1 sub-modules or HT2 sub-modules is turned on to dim the sign or display brightness.

5. An LED-illuminated sign or display unit according to claim 1, wherein the composite "plus-sign" LED modules placed at intersecting nodes, comprise of sub-modules containing single or plurality of individual LED chip or emitters.

6. An LED-illuminated sign or display unit according to claim 1, wherein all such lighting sources as LED chip, emitters or sub-modules are detachable and replaceable in case of damage.

7. An LED-illuminated sign or display unit according to claim 1, wherein the plurality of plates or fins are constructed with metals or other thermally conductive materials to serve as heat sinks for the LED modules and sub-modules that require heat dissipation through conduction and wherein the spaces between the plates or fins provide room for air flow allowing further heat dissipation via convection and wherein the spaces are used for inserting vent holes at the back of the sign or display unit for additional heat dissipation, and wherein the spaces are used to place additional electrical or thermal control devices for the sign and display.

* * * * *